(12) United States Patent
Hirayama et al.

(10) Patent No.: US 10,290,476 B2
(45) Date of Patent: May 14, 2019

(54) PLASMA PROCESSING METHOD AND PLASMA PROCESSING APPARATUS

(71) Applicant: TOKYO ELECTRON LIMITED, Tokyo (JP)

(72) Inventors: Yusuke Hirayama, Miyagi (JP); Masaaki Miyagawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/517,466

(22) PCT Filed: Sep. 25, 2015

(86) PCT No.: PCT/JP2015/077031
§ 371 (c)(1),
(2) Date: Apr. 6, 2017

(87) PCT Pub. No.: WO2016/056399
PCT Pub. Date: Apr. 14, 2016

(65) Prior Publication Data
US 2017/0316919 A1    Nov. 2, 2017

(30) Foreign Application Priority Data
Oct. 7, 2014 (JP) .................................. 2014-206665

(51) Int. Cl.
*H01J 37/32* (2006.01)
*C23C 16/44* (2006.01)
(Continued)

(52) U.S. Cl.
CPC ........ *H01J 37/32862* (2013.01); *B29C 59/14* (2013.01); *C23C 16/0272* (2013.01);
(Continued)

(58) Field of Classification Search
CPC ........... H01J 37/32009; H01J 37/32532; H01J 37/32917; H01J 37/32165;
(Continued)

(56) References Cited

U.S. PATENT DOCUMENTS 6,071,573 A * 6/2000 Koemtzopoulos .......................... C23C 16/4404 427/237
6,624,064 B1 * 9/2003 Sahin .................. C23C 16/4404 438/627

(Continued)

FOREIGN PATENT DOCUMENTS

JP    2013-214584 A    10/2013

OTHER PUBLICATIONS

International Search Report dated Dec. 8, 2015 for PCT/JP2015/077031.

*Primary Examiner* — Jiong-Ping Lu
(74) *Attorney, Agent, or Firm* — Rothwell, Figg, Ernst & Manbeck, P.C.

(57) ABSTRACT

A plasma processing method including: a film formation step of forming a silicon-containing film on a surface of a member inside a chamber by plasma of a silicon-containing gas and a reducing gas; a plasma processing step of plasma-processing a workpiece carried into the chamber by plasma of a processing gas after the silicon-containing film is formed on the surface of the member; and a removal step of removing the silicon-containing film from the surface of the member by plasma of a fluorine-containing gas after the plasma-processed workpiece is carried out of the chamber.

15 Claims, 7 Drawing Sheets

(51) Int. Cl.
*H01L 21/205* (2006.01)
*H01L 21/3065* (2006.01)
*H05H 1/46* (2006.01)
*B29C 59/14* (2006.01)
*C23C 16/02* (2006.01)
*C23C 16/509* (2006.01)

(52) U.S. Cl.
CPC .......... *C23C 16/44* (2013.01); *C23C 16/4405* (2013.01); *C23C 16/509* (2013.01); *H01J 37/32009* (2013.01); *H01J 37/32082* (2013.01); *H01J 37/32165* (2013.01); *H01J 37/32532* (2013.01); *H01J 37/32917* (2013.01); *H01L 21/205* (2013.01); *H01L 21/3065* (2013.01); *H05H 1/46* (2013.01); *C23C 16/4404* (2013.01); *H01J 37/32477* (2013.01); *H01J 37/32495* (2013.01); *H01J 2237/334* (2013.01)

(58) Field of Classification Search
CPC .......... H01J 37/32082; H01J 37/32477; H01J 37/32495; H01J 2237/334; B29C 59/14; C23C 16/44; C23C 16/4404; H01L 21/3065

See application file for complete search history.

(56) References Cited

U.S. PATENT DOCUMENTS

| | | | |
|---|---|---|---|
| 6,846,742 B2* | 1/2005 | Rossman | C23C 16/4404 134/11 |
| 7,981,809 B2* | 7/2011 | Shibata | H01L 21/3144 438/775 |
| 7,989,365 B2* | 8/2011 | Park | C23C 16/401 257/E21.278 |
| 2005/0191827 A1 | 9/2005 | Collins et al. | |
| 2007/0004220 A1* | 1/2007 | Tran Quoc | C03C 17/3447 438/758 |
| 2007/0204797 A1* | 9/2007 | Fischer | C23C 16/4404 118/723 R |
| 2008/0000423 A1 | 1/2008 | Fukiage | |
| 2009/0061092 A1* | 3/2009 | Kameshima | C23C 16/4404 427/255.394 |

* cited by examiner

| SiF4/CH4<br>=300/100sccm | UEL C<br>(90) | UEL E<br>(91) | UEL Ex<br>(92) | D/S<br>(93) | Buffle<br>(94) |
|---|---|---|---|---|---|
| Deposit amount (nm/2min) | 296 | 190 | 143 | 139 | 151 |
| Etch amount (nm/2min) | 18.0 | 8.0 | 13.0 | 33.0 | 25.0 |

| SiF4/O2/Ar<br>=300/300/100sccm | UEL C<br>(90) | UEL E<br>(91) | UEL Ex<br>(92) | D/S<br>(93) | Buffle<br>(94) |
|---|---|---|---|---|---|
| Deposit amount (nm/2min) | 210 | 192 | 171 | 96 | 108 |
| Etch amount (nm/2min) | 45.0 | 68.0 | 62.0 | 62.0 | 47.0 |

FIG. 11A     FIG. 11B

FIG. 12A  FIG. 12B
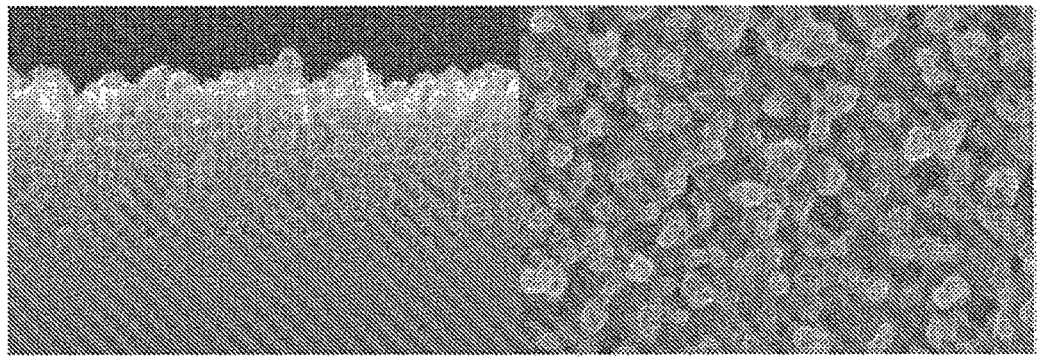
FIG. 13
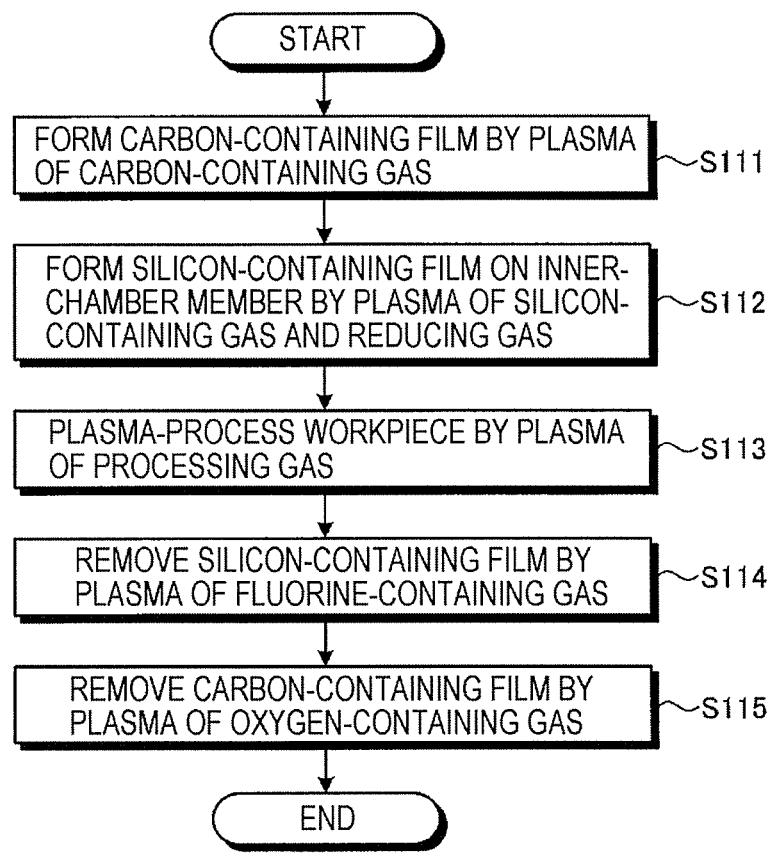

PLASMA PROCESSING METHOD AND PLASMA PROCESSING APPARATUS

CROSS REFERENCE TO RELATED APPLICATIONS

This application is a national phase of PCT application No. PCT/JP2015/077031, filed on 25 Sep. 2015, which claims priority from Japanese patent application No. 2014-206665, filed on 7 Oct. 2014, all of which are incorporated herein by reference.

TECHNICAL FIELD

Various aspects and exemplary embodiments of the present disclosure relate to a plasma processing method and a plasma processing apparatus.

BACKGROUND

In a semiconductor manufacturing process, a plasma processing apparatus has been widely used to perform a plasma processing for the purpose of deposition or etching of a thin film. Examples of the plasma processing apparatus include a plasma chemical vapor deposition (CVD) apparatus for performing a thin film deposition processing and a plasma etching apparatus for performing an etching processing.

Meanwhile, in the plasma processing apparatus, a member disposed inside the chamber (hereinafter, referred to as an "in-chamber member" as appropriate) is exposed to plasma of a processing gas during various types of plasma processings. Thus, plasma resistance is required. In this regard, for example, Patent Document 1 discloses a method of enhancing plasma resistance of an in-chamber member by supplying a silicon-containing gas containing oxygen at a gas flow rate ratio of oxygen to $SiF_4$ of 1.7 or more to form a fluorine-containing silicon oxide film as a protective film on the surface of the in-chamber member, before performing a plasma processing on a workpiece.

PRIOR ART DOCUMENT

Patent Document

Patent Document 1: U.S. Pat. No. 6,071,573.

DISCLOSURE OF THE INVENTION

Problems to be Solved

However, in the conventional technique in which the fluorine-containing silicon oxide film is formed as a protective film on the surface of the in-chamber member, the etch amount of the silicon oxide film by the plasma of the processing gas increases.

That is, in the conventional technique, the silicon-containing gas containing oxygen is supplied at a gas flow rate ratio of oxygen to $SiF_4$ of 1.7 or more. Further, oxygen radicals and silicon radicals in the plasma of the silicon-containing gas containing oxygen react in the space inside the chamber to generate silicon oxide, and the generated silicon oxide is deposited as a silicon oxide film in the in-chamber member. Since the silicon oxide film deposited on the in-chamber member contains residual halogens such as, for example, F (fluorine), the etching may be performed beyond the film thickness of the silicon oxide film by the plasma of the processing gas in some cases. For this reason, in the conventional technique, the surface of the in-chamber member was deteriorated and worn. Thus, the protection of the in-chamber member was not sufficient.

Means to Solve the Problems

According to an aspect, a plasma processing method of the present disclosure includes a film formation step, a plasma processing step, and a removal step. In the film formation step, a silicon-containing film is formed on a surface of a member disposed inside a chamber by plasma of a silicon-containing gas and a reducing gas. In the plasma processing step, a workpiece carried into the chamber is plasma-processed by plasma of a processing gas after the silicon-containing film is formed on the surface of the member. In the removal step, the silicon-containing film is removed from the surface of the member by plasma of a fluorine-containing gas after the plasma-processed workpiece is carried out of the chamber.

Effect of the Invention

According to various aspects and exemplary embodiments of the present disclosure, a plasma processing method and a plasma processing apparatus capable of protecting a member disposed inside a chamber from plasma and suppressing the deterioration and wear of the member, are realized.

BRIEF DESCRIPTION OF THE DRAWINGS

FIGS. 11A and 11B are views illustrating an exemplary cross-section and a surface of the silicon-containing film of the comparative example after the deposition, respectively.

FIGS. 12A and 12B are views illustrating an exemplary cross-section and a surface of the silicon-containing film of the comparative example after the plasma processing, respectively.

FIG. 13 is a flowchart illustrating another exemplary process flow of a plasma processing method by a plasma processing apparatus according to an exemplary embodiment of the present disclosure.

DETAILED DESCRIPTION TO EXECUTE THE INVENTION

Figure 1:
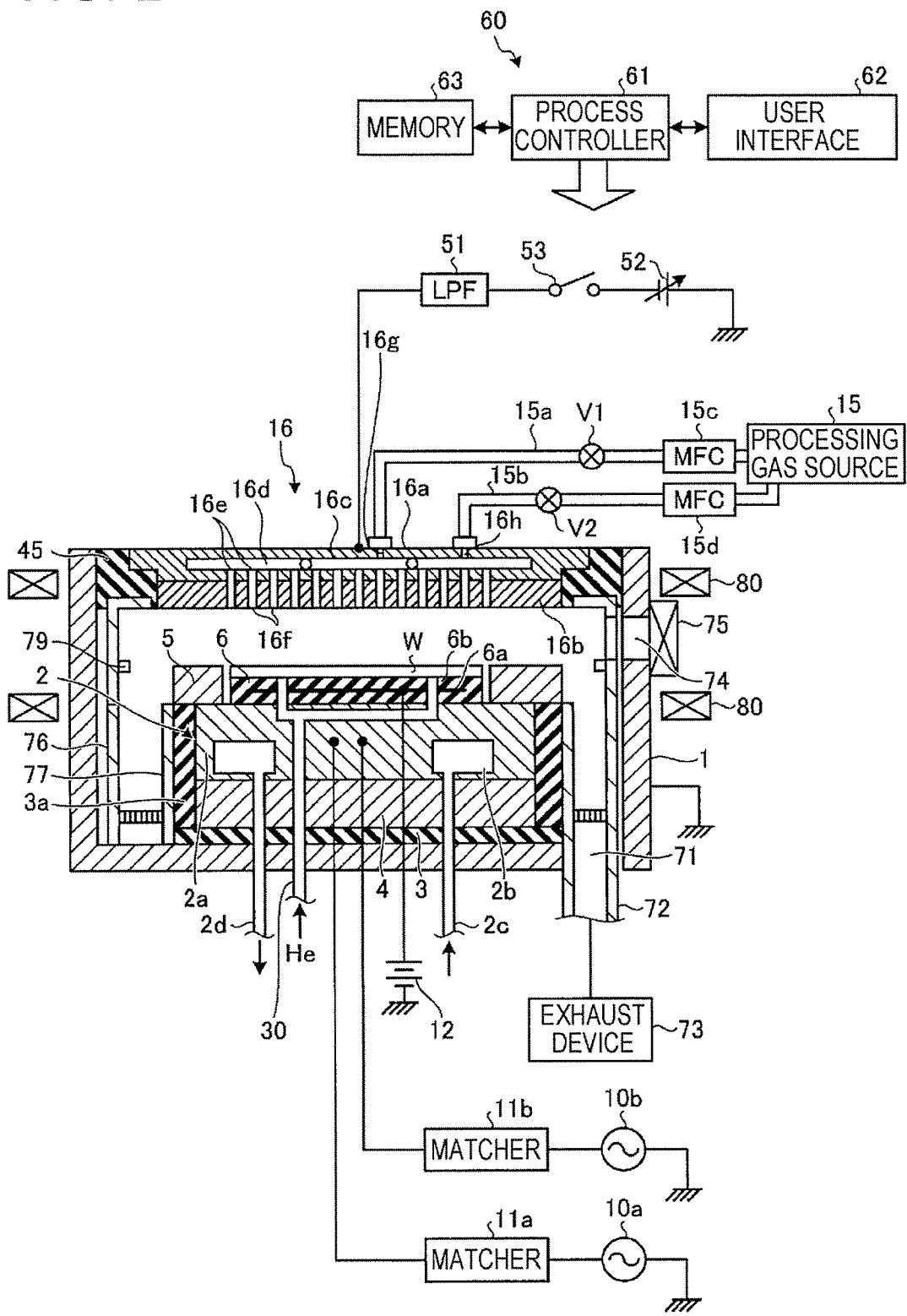
FIG. 1 is a schematic cross-sectional view illustrating a plasma processing apparatus which is adopted to a plasma etching method according to an exemplary embodiment of the present disclosure.

Hereinafter, various exemplary embodiments will be described in detail with reference to the drawings. Meanwhile, in the respective drawings, the same or corresponding parts will be denoted by the same symbols.

According to an exemplary embodiment of the present disclosure, a plasma processing method includes: a film formation step of forming a silicon-containing film on a surface of a member disposed inside a chamber by plasma of a silicon-containing gas and a reducing gas; a plasma processing step of plasma-processing a workpiece carried into the chamber by plasma of a processing gas after the silicon-containing film is formed on the surface of the member; and a removal step of removing the silicon-containing film from the surface of the member by plasma of a fluorine-containing gas after the plasma-processed workpiece is carried out of the chamber.

In an exemplary embodiment of the above-described plasma processing method, the silicon-containing gas contains at least one of $SiF_4$, $SiCl_4$, and $SiBr_4$.

In an exemplary embodiment of the above-described plasma processing method, the reducing gas contains at least one of $H_2$, $CH_4$, and $C_3H_6$.

In an exemplary embodiment of the above-described plasma processing method, in the film formation step, a flow rate ratio of the reducing gas to the silicon-containing gas is 0.2 or more.

In an exemplary embodiment, the above-described plasma processing method further includes a pre-film formation step of forming a carbon-containing film on the surface of the member by plasma of a carbon-containing gas before the film formation step.

In an exemplary embodiment of the above-described plasma processing method, the carbon-containing gas contains a gas represented by $C_xH_yF_z$ (wherein x, y, z represents an integer, and (z−y)/x is 2 or less).

In an exemplary embodiment of the above-described plasma processing method, the carbon-containing gas contains at least one of $CH_4$, $C_4H_8$, $CHF_3$, $CH_3F$, and $C_2H_4$.

In an exemplary embodiment of the above-described plasma processing method, the removal step includes a first removal step of removing the silicon-containing film from the surface of the member by the plasma of the fluorine-containing gas and a second removal step of removing the carbon-containing film from the surface of the member by plasma of an oxygen-containing gas.

In an exemplary embodiment of the above-described plasma processing method, the silicon-containing gas further contains a rare gas.

In an exemplary embodiment of the above-described plasma processing method, the rare gas is Ar or He.

According to another exemplary embodiment of the present disclosure, a plasma processing apparatus includes: a chamber in which a workpiece is plasma-processed; an exhaust unit that decompresses an inside of the chamber; a gas supply unit that supplies a processing gas to the inside of the chamber; and a controller that performs a film formation step of forming a silicon-containing film on a surface of a member disposed inside a chamber by plasma of a silicon-containing gas and a reducing gas; a plasma processing step of plasma-processing a workpiece carried into the chamber by plasma of a processing gas after the silicon-containing film is formed on the surface of the member; and a removal step of removing the silicon-containing film from the surface of the member by plasma of a fluorine-containing gas after the plasma-processed workpiece is carried out of the chamber.

FIG. 1 is a schematic cross-sectional view illustrating a plasma processing apparatus which is adopted to a plasma etching method according to an exemplary embodiment of the present disclosure. The plasma processing apparatus illustrated in FIG. 1 includes a processing chamber 1 that is airtightly constituted and electrically grounded. The processing chamber 1 has a cylindrical shape and is made of, for example, aluminum having an anodized film formed on the surface thereof. A placing table 2 is provided in the processing chamber 1 to horizontally support a semiconductor wafer W serving as a workpiece.

The placing table 2 has a base 2a made of a conductive metal (e.g., aluminum) and functions as a lower electrode. The placing table 2 is supported by a conductive support table 4 through an insulating plate 3. In addition, a focus ring 5 made of, for example, single-crystal silicon, is provided on an outer periphery of the top of the placing table 2. Further, a cylindrical inner wall member 3a made of, for example, quartz, is provided to surround the periphery of the placing table 2 and the support table 4.

A shower head 16 is provided above the placing table 2 to face the placing table in parallel, in other words, to face the semiconductor wafer W supported on the placing table 2, and functions as an upper electrode. The shower head 16 and the placing table 2 function as a pair of electrodes (the upper and lower electrodes). A first high frequency power source 10a is connected to the base 2a of the placing table 2 via a first matcher 11a. Further, a second high frequency power source 10b is connected to the base 2a of the placing table 2 via a second matcher 11b. The first high frequency power source 10a is for plasma generation, and a high frequency power of a predetermined frequency (e.g., 100 MHz) is supplied from the first high-frequency power source 10a to the base 2a of the placing table 2. Further, the second high frequency power source 10b is for ion attraction (bias), and a high frequency power of a predetermined frequency lower than that of the first high frequency power source 10a (e.g., 13 MHz) is supplied from the second high-frequency power source 10b to the base 2a of the placing table 2.

An electrostatic chuck 6 is provided on the top surface of the placing table 2 to electrostatically attract the semiconductor wafer W. The electrostatic chuck 6 is constituted by interposing an electrode 6a between insulators 6b, and a DC power source 12 is connected to the electrode 6a. Then, a DC voltage is applied from the DC power source 12 to the electrode 6a, so that the semiconductor wafer W is attracted by a Coulomb force.

A coolant flow path 2b is formed inside the placing table 2. The coolant flow path 2b is connected with a coolant inlet pipe 2c and a coolant outlet pipe 2d. Then, the support table 4 and the placing table 2 may be controlled to a predetermined temperature by circulating a coolant such as, for example, Galden in the coolant flow path 2b. Further, a backside gas supply pipe 30 passes through the placing table 2 to supply a cold heat transfer gas (a backside gas) such as, for example, helium gas to the rear surface side of the semiconductor wafer W. The backside gas supply pipe 30 is connected to a backside gas source (not illustrated). With the configuration, the semiconductor wafer W attracted to and held on the top surface of the placing table 2 by the electrostatic chuck 6 may be controlled to a predetermined temperature.

The shower head 16 described above is provided on the ceiling wall portion of the processing chamber 1. The shower head 16 includes a main body 16a and an upper top plate 16b forming an electrode plate, and is supported in an upper portion of the processing chamber 1 via an insulating member 45. The main body 16a is made of a conductive material, for example, aluminum of which the surface is anodized, and is configured such that the upper top plate 16b is detachably supported under the main body 16a. The upper top plate 16b is made of a silicon-containing material, for example, quartz.

A gas diffusion chamber is provided inside the main body 16a, and a plurality of gas flow holes 16e are formed in the bottom portion of the main body 16a so as to be positioned under the gas diffusion chambers 16c and 16d. The gas diffusion chamber is divided into two portions, i.e., a gas diffusion chamber 16c provided in the central portion and a gas diffusion chamber 16d provided in the peripheral portion, and is configured such that the supply state of the processing gas is independently changed in the central portion and the peripheral portion.

In addition, gas introduction holes 16f are provided in the upper top plate 16b to penetrate the upper top plate 16b in the thickness direction and overlap with the gas flow holes 16e. With the configuration, the processing gas supplied to the gas diffusion chambers 16c, 16d is diffused in a shower form through the gas flow holes 16e and the gas introduction holes 16f and supplied into the processing chamber 1. A temperature adjustor such as, for example, a heater (not illustrated) or a pipe (not illustrated) for circulating the coolant, is provided in, for example, the main body 16a, so that the temperature of the shower head 16 is controlled to a desired temperature during the plasma etching process.

The main body 16a includes two gas introduction ports 16g, 16h to introduce the processing gas to the gas diffusion chambers 16c, 16d. The gas introduction ports 16g, 16h are connected with gas supply pipes 15a, 16b, respectively. The other ends of the gas supply pipes 15a, 16b are connected with a processing gas source 15 that supplies an etching processing gas. The processing gas source 15 is an example of the gas supply unit. The gas supply pipe 15a is provided with a mass flow controller (MFC) 15c and an opening/closing valve V1 in this order from the upstream side. In addition, the gas supply pipe 15b is provided with a mass flow controller (MFC) 15d and an opening/closing valve V2 in this order from the upstream side.

Then, a processing gas for plasma etching is supplied from the processing gas source 15 to the gas diffusion chambers 16c, 16d through the gas supply pipes 15a, 15b, diffused in a shower form from the gas diffusion chambers 16c, 16d through the gas flow holes 16e and the gas introduction holes 16f, and supplied into the processing chamber 1. For example, a silicon-containing gas and a reducing gas, which are used for forming a silicon-containing film on the surface of a member disposed inside the processing chamber 1 as described later, is supplied from the processing gas source 15. In addition, for example, a processing gas containing HBr/NF$_3$, which is used for plasma-processing the workpiece, is supplied from the processing gas source 15. Further, for example, a fluorine-containing gas, which is used for removing the silicon-containing film on the surface of the member disposed inside the processing chamber 1, is supplied from the processing gas source 15. The details of the gas to be supplied from the processing gas source 15 will be described later.

The shower head 16 serving as an upper electrode is electrically connected with a variable DC power source 52 via a low pass filter (LPF) 51 and a switch 53. The variable DC power source 52 is capable of turning on/off the power supply by an ON/OFF switch 53. The current and voltage of the variable DC power source 52 and the ON/OFF of the ON/OFF switch 53 are controlled by a controller 16 (to be described later). As will be described later, when high frequency waves are applied from the first high frequency power source 10a and the second high frequency power source 10b to the placing table 2 to generate plasma in the processing space, the ON/OFF switch 53 is turned on by the controller 60 so that a predetermined DC voltage is applied to the shower head 16 serving as an upper electrode.

An exhaust port 71 is formed in the bottom portion of the processing chamber 1, and an exhaust device 73 is connected to the exhaust port 71 via an exhaust pipe 72. The exhaust device 73 includes a vacuum pump which, when operated, decompresses the interior of the processing chamber 1 to a predetermined degree of vacuum. The exhaust device 73 is an example of the exhaust unit. Meanwhile, a carry-in/out port 74 for the semiconductor wafer W is provided on a sidewall of the processing chamber 1, and a gate valve 75 is provided in the carry-in/out port 74 to open and close the carry-in/out port 74.

In the figure, reference numerals 76 and 77 denote detachable deposit shields. The deposit shield 76 is provided along the inner wall surface of the processing chamber 1 and plays a role of suppressing any etching byproduct (deposit) from being attached to the processing chamber 1. Hereinafter, the inner wall of the processing chamber 1 and the deposit shield 76 may be collectively referred to as "the inner wall of the processing chamber 1" in some cases. In addition, the deposit shield 77 is provided to cover the outer periphery of the placing table 2, the inner wall member 3a, and the support table 4, which serve as a lower electrode. Hereinafter, the placing table 2, the inner wall member 3a, the support table 4, and the deposit shield 77 may be collectively referred to as a "lower electrode" in some cases. A conductive member (GND block) 79 connected to the ground in a direct current manner is provided at substantially the same height position as the semiconductor wafer W of the deposit shield 76. Thus, abnormal discharge is suppressed.

Further, a ring magnet 80 is concentrically disposed around the chamber 1. The ring magnet 80 applies a magnetic field to the processing space between the shower head 16 and the placing table 2. The ring magnet 80 is rotatable by a rotation mechanism (not illustrated).

The operation of the plasma etching apparatus having the above configuration is generally controlled by the controller 60. The controller 60 is provided with a process controller 61 that includes a CPU and controls each part of the plasma etching apparatus, a user interface 62, and a memory 63.

The user interface 62 includes, for example, a keyboard or a touch panel for inputting commands by a process manager to manage the plasma etching apparatus, and a display for visually displaying the operation status of the plasma etching apparatus.

The memory 63 stores a control program (software) for realizing various processings performed in the plasma etching apparatus by the control of the controller 61, or recipe in which, for example, a processing condition data is stored. Then, an arbitrary recipe is called from the memory 63 by an instruction from the user interface 62 as necessary, and executed by the process controller 61. Therefore, a desired processing is performed in the plasma etching apparatus under the control of the process controller 61. Further, the control program or the recipe of, for example, the processing condition data may be used in a state of being stored in a computer-readable computer storage medium (e.g., a hard disc, a CD, a flexible disc, or a semiconductor memory), or may be used on-line by being transmitted at any time from other devices, for example, through a dedicated line.

For example, the controller 60 controls the respective parts of the plasma processing apparatus to perform the plasma processing method (to be described later). As a detailed example, the controller 60 forms a silicon-containing film on a surface of a member disposed inside the chamber by plasma of a silicon-containing gas and a reducing gas. Then, after the silicon-containing film is formed on the surface of the member, the controller 60 plasma-processes a workpiece carried into the processing chamber 1 by plasma of a processing gas. Then, after the plasma-processed workpiece is carried out of the processing chamber 1, the controller 60 removes the silicon-containing film from the surface of the member by plasma of a fluorine-containing gas. Here, the member disposed inside the processing chamber 1 includes, for example, the inner wall of the processing chamber 1, and the placing table 2, the inner wall member 3a, the support table 4, and the deposit shield 77, which are disposed inside the processing chamber 1 and serve as a lower electrode. Hereinafter, the member disposed inside the processing chamber 1 may be referred to as an "in-chamber member" in some cases. Further, another member includes a shower head 16 which is an upper electrode facing the lower electrode inside the processing chamber 1. Further, the workpiece is, for example, a semiconductor wafer W.

Figure 2:
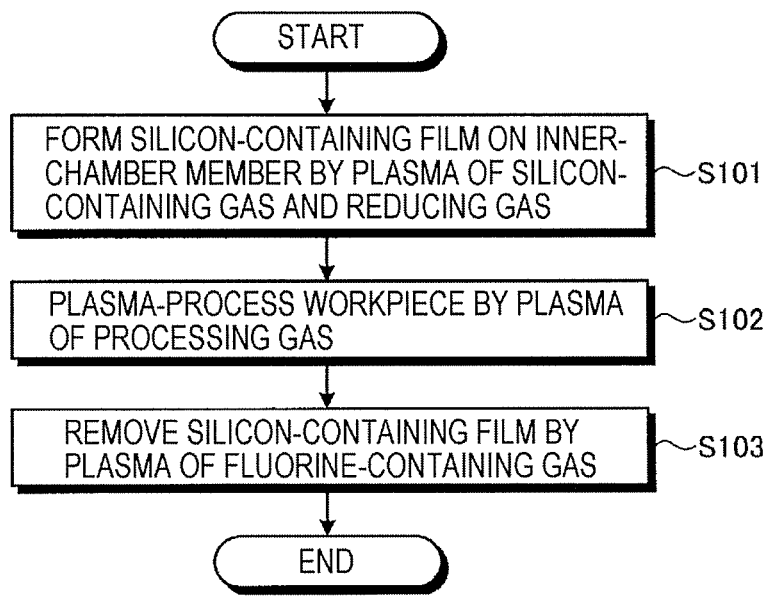
FIG. 2 is a flowchart illustrating an exemplary process flow of a plasma processing method by a plasma processing apparatus according to the exemplary embodiment.

Next, the plasma processing method of the plasma processing apparatus according to the exemplary embodiment will be described. FIG. 2 is a flowchart illustrating an exemplary process flow of a plasma processing method by a plasma processing apparatus according to an exemplary embodiment of the present disclosure.

As illustrated in FIG. 2, the plasma processing apparatus performs a film formation step to form a silicon-containing film on the surface of the in-chamber member by plasma of a silicon-containing gas and a reducing gas (step S101). The in-chamber member includes, for example, the inner wall of the processing chamber 1, and the placing table 2, the inner wall member 3a, the support table 4, and the deposit shield 77, which are disposed inside the processing chamber 1 and serve as a lower electrode. Further, another member includes a shower head 16 which is an upper electrode facing the lower electrode inside the processing chamber 1. Further, the silicon-containing gas contains, for example, at least one of $SiF_4$, $SiCl_4$, and $SiBr_4$. Further, the reducing gas contains, for example, at least one of $H_2$, $CH_4$, and $C_3H_6$. Further, a flow rate ratio of the reducing gas to the silicon-containing gas is, for example, 0.2 or more. That is, the flow rate ratio (e.g., $H_2/SiF_4$) is 0.2 or more. The silicon-containing gas may further contain a rare gas. The rare gas is, for example, Ar or He.

The plasma processing apparatus generates a deposit, which is a silicon-containing film, on the surface of the in-chamber member by the film formation step. The controller 60 of the plasma processing apparatus supplies the silicon-containing gas and the reducing gas from the processing gas source 15 into the processing chamber 1, and applies a high frequency power for plasma generation from the first high frequency power source 10a into the processing chamber 1 to generate plasma of the silicon-containing gas and the reducing gas. At this time, the controller 60 does not apply a high frequency power for ion attraction from the second high frequency power source 10b. As a result, a deposit is formed as a silicon-containing film on the surface of the in-chamber member.

Figure 3:
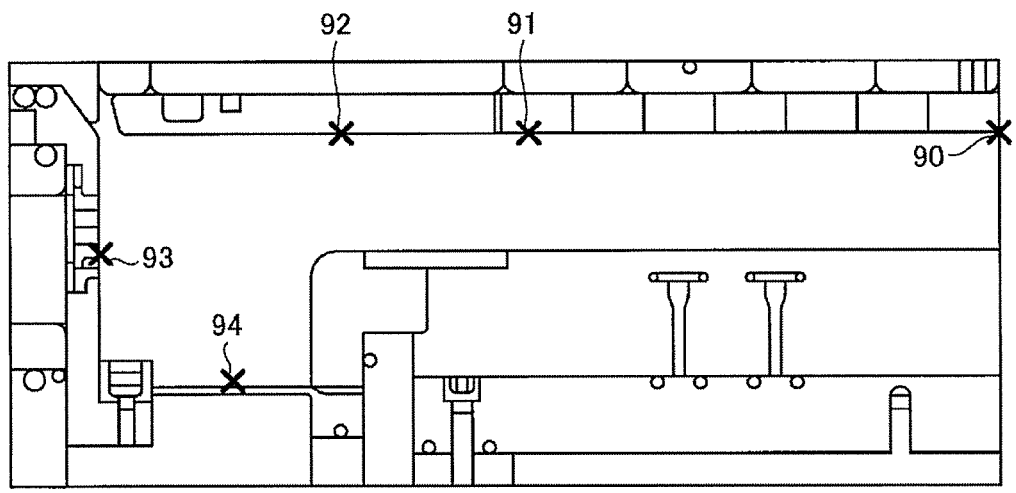
FIG. 3 is a view for explaining exemplary measurement points of a deposit amount in a chamber in the exemplary embodiment.

The amount of the silicon-containing film (deposit) formed on the surface of the in-chamber member is different in each part of the processing chamber 1. FIG. 3 is a view for explaining exemplary measurement points of a deposit amount in the chamber in the exemplary embodiment. As illustrated in FIG. 3, as measurement points of the deposit amount, for example, a measurement point 90 which is the center of the upper top plate 16b (UEL Cent), a measurement point 91 which is an edge of the upper top plate 16b (UEL Edge), a measurement point 92 which is a top wall portion of the processing chamber 1 corresponding to the exhaust port 71 (UEL Exhaust), a measurement point 93 of the deposit shield 76 (D/S), and a measurement point 94 of the buffle (Buffle) are provided.

Figure 4:
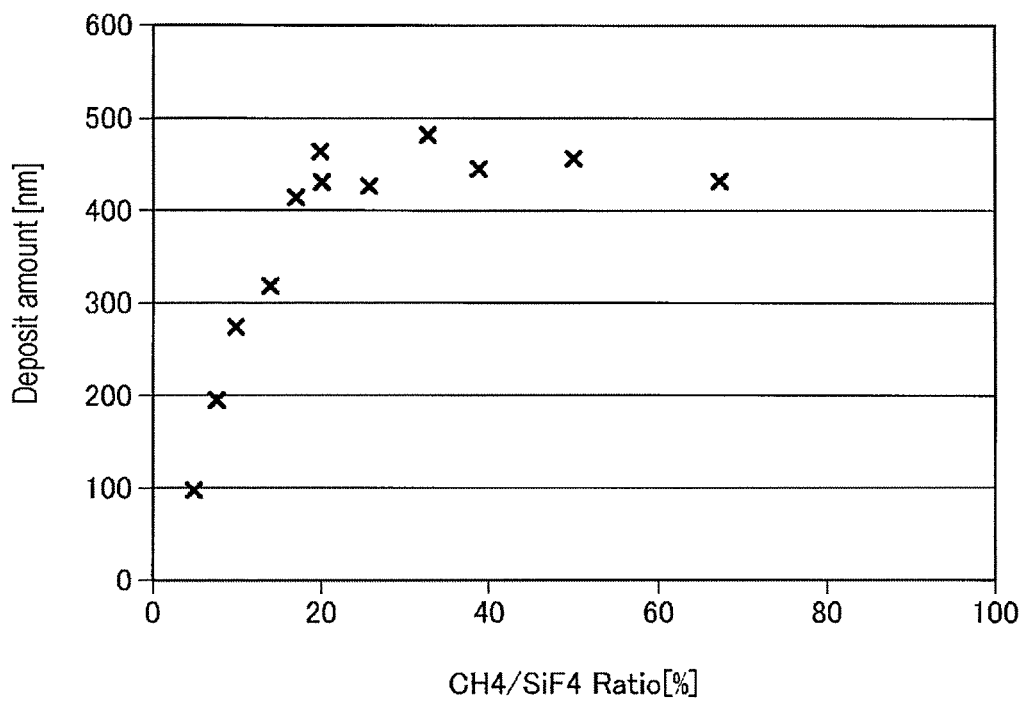
FIG. 4 is a graph illustrating exemplary ratio of a reducing gas to a silicon-containing gas and deposit amount.

FIG. 4 is a graph illustrating exemplary ratio of the reducing gas to the silicon-containing gas and deposit amount. FIG. 4 illustrates a film thickness of the deposit when the flow rate ratio is changed by using $SiF_4$ as the silicon-containing gas and $CH_4$ as the reducing gas. As illustrated in FIG. 4, the efficiency of CVD may be maximized by adding 20% or more, preferably 20% of $CH_4$ to $SiF_4$.

Figure 5:
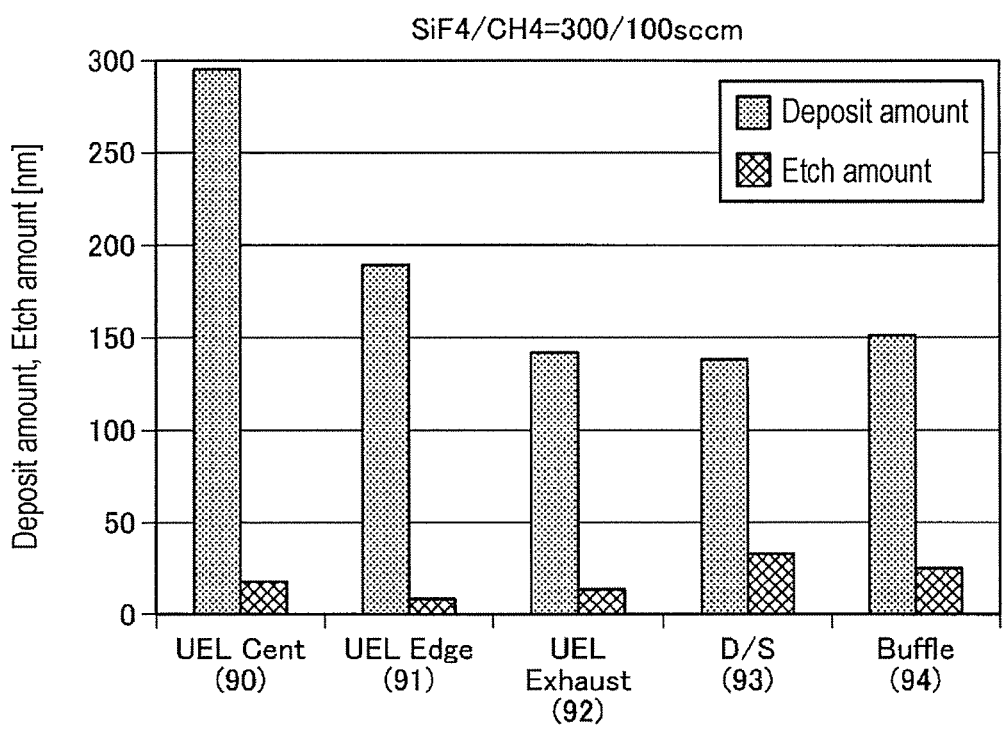
FIG. 5 is a graph illustrating an exemplary deposit amount and an etch amount of the silicon-containing film in the exemplary embodiment.
Figures 6, 7A, 7B:
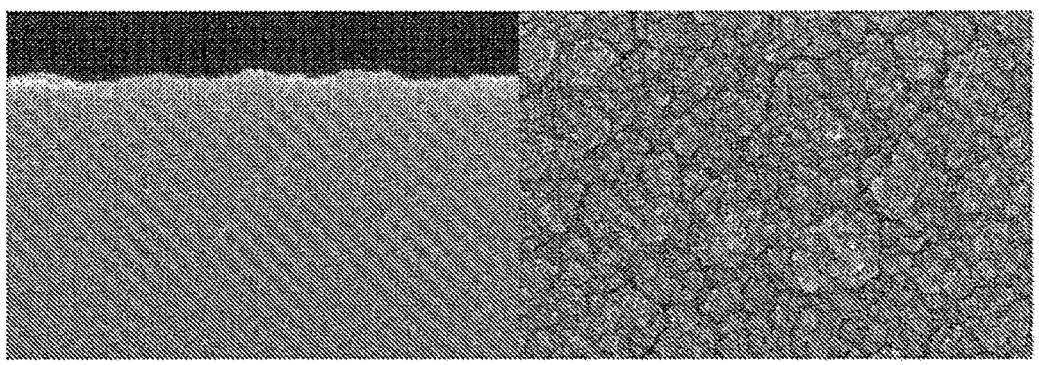
FIG. 6 is a table illustrating an exemplary deposit amount and an etch amount of the silicon-containing film in the exemplary embodiment.
FIGS. 7A and 7B are views illustrating an exemplary cross-section and a surface of the silicon-containing film of the exemplary embodiment after the deposition, respectively.

FIGS. 5 and 6 are views illustrating an exemplary deposit amount and an etch amount of the silicon-containing film in the exemplary embodiment. In FIGS. 5 and 6, $SiF_4$ is used as the silicon-containing gas, and $CH_4$ is used as the reducing gas. Further, FIGS. 5 and 6 illustrate a deposit amount at each of the measurement points 90 to 94 in a case where the film formation conditions are 20 mT, 800 W, and 2 minutes, and the flow rate ratio is $SiF_4/CH_4$=300/100 sccm, that is, a film thickness of the silicon-containing film (deposit). Further, FIGS. 5 and 6 illustrate an etch amount at each of the measurement points 90 to 94 in a case where the plasma resistance evaluation conditions are 20 mT and 800 W with $CF_4$ gas for 30 seconds, $H_2/N_2$ gas for 60 seconds, $CF_4$ gas for 30 seconds, and $O_2/Ar$ gas for 30 seconds, that is, an etch amount of the silicon-containing film (deposit).

Figures 8A, 8B:
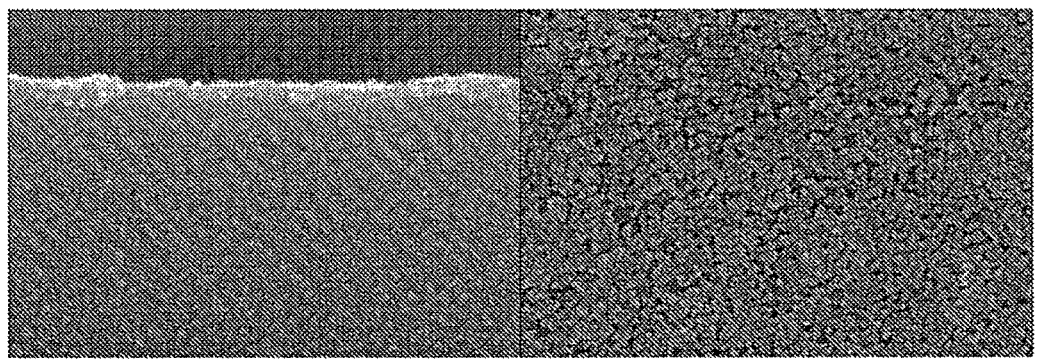
FIGS. 8A and 8B are views illustrating an exemplary cross-section and a surface of the silicon-containing film of the exemplary embodiment after the plasma processing, respectively.

FIGS. 7A and 7B are views illustrating an exemplary cross-section and a surface of the silicon-containing film of the exemplary embodiment after the deposition, respectively. FIG. 7A illustrates the exemplary cross-section of the deposit at the measurement point 90, and FIG. 7B illustrates the exemplary surface of the deposit at the measurement point 90. FIGS. 8A and 8B are views illustrating an exemplary cross-section and a surface of the silicon-containing film of the exemplary embodiment after the plasma processing, respectively. FIG. 8A illustrates the exemplary cross-section of the deposit at the measurement point 90 after the plasma processing, and FIG. 8B illustrates the exemplary surface of the deposit at the measurement point 90 after the plasma processing. Comparing FIGS. 7A and 7B and FIGS. 8A and 8B, the deposit at the measurement point 90 has a small change in deposit state before and after the plasma processing, and a silicon-containing film having a high plasma resistance is formed.

Figure 9:
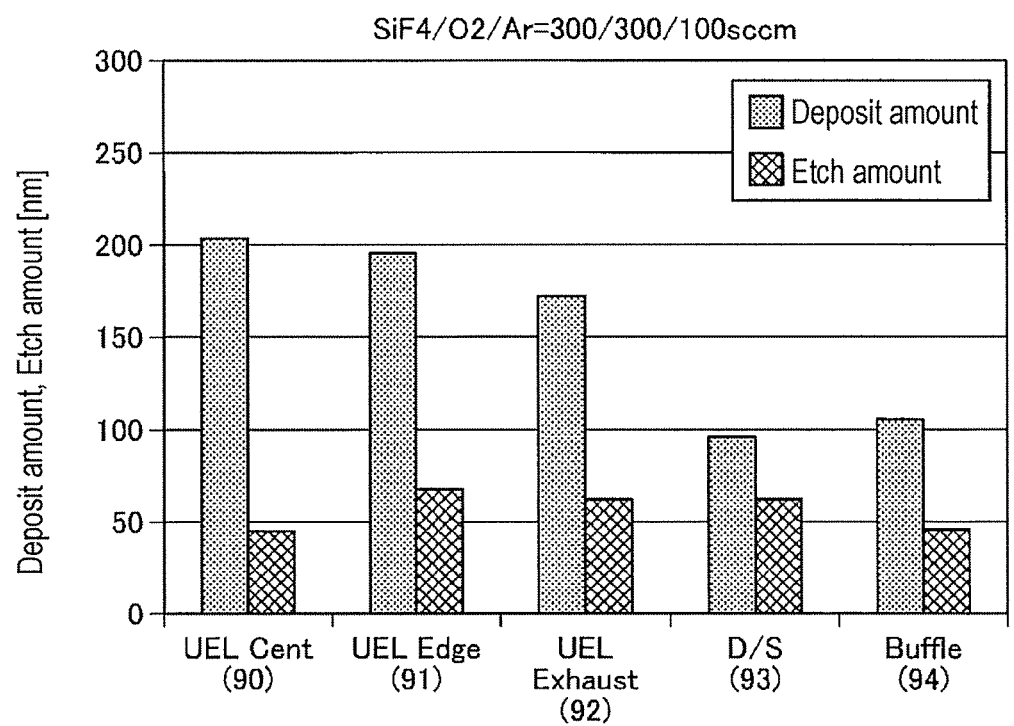
FIG. 9 is a graph illustrating an exemplary deposit amount and an etch amount of a silicon-containing film in a comparative example.
Figure 10:
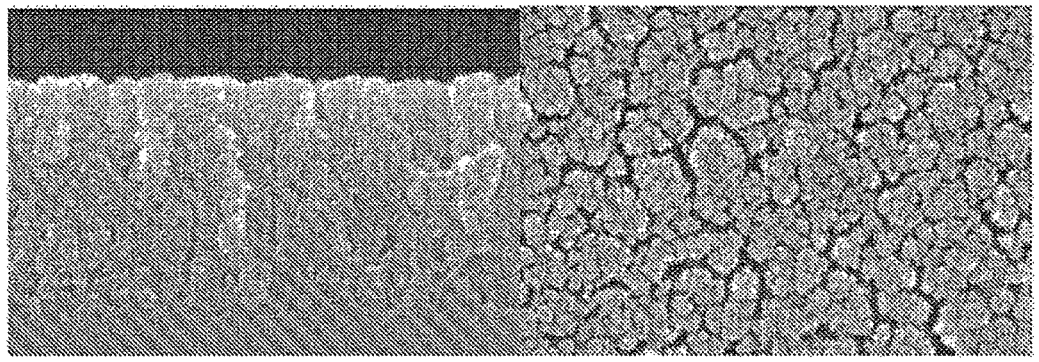
FIG. 10 is a table illustrating an exemplary deposit amount and an etch amount of the silicon-containing film in the comparative example.

FIGS. 9 and 10 are views illustrating an exemplary deposit amount and an etch amount of the silicon-containing film in a comparative example. In FIGS. 9 and 10, $SiF_4$ is used as the silicon-containing gas, $O_2$ is used as the oxygen-containing gas, and Ar is used as the rare gas. Further, FIGS.

9 and 10 illustrate a film thickness of the silicon-containing film (deposit) at each of the measurement points 90 to 94 in a case where the film formation conditions are 20 mT, 800 W, and 2 minutes, and the flow rate ratio is $SiF_4/O_2/Ar=300/300/100$ sccm. Further, FIGS. 9 and 10 illustrate the etch amount at each of the measurement points 90 to 94 in a case where the plasma resistance evaluation conditions are 20 mT and 800 W with $CF_4$ gas for 30 seconds, $H_2/N_2$ gas for 60 seconds, $CF_4$ gas for 30 seconds, and $O_2/Ar$ gas for 30 seconds, that is, the etch amount of the silicon-containing film (deposit).

FIGS. 11A and 11B are views illustrating an exemplary cross-section and a surface of the silicon-containing film of the comparative example after the deposition, respectively. FIG. 11A illustrates the exemplary cross-section of the deposit at the measurement point 90, and FIG. 11B illustrates the exemplary surface of the deposit at the measurement point 90. FIGS. 12A and 12B are views illustrating an exemplary cross-section and a surface of the silicon-containing film of the comparative example after the plasma processing, respectively. FIG. 12A illustrates the exemplary cross-section of the deposit at the measurement point 90 after the plasma processing, and FIG. 12B illustrates the exemplary surface of the deposit at the measurement point 90 after the plasma processing. Comparing FIGS. 11A and 11B and FIGS. 12A and 12B, it can be seen that the deposit at the measurement point 90 is etched by the plasma processing so that the state of the surface is roughened.

In the silicon-containing film of the exemplary embodiment illustrated in FIGS. 5, 6, 7A, 7B, 8A, and 8B, the etch amount by the plasma processing is reduced, and the cross-section and the surface of the deposit are dense, as compared with the silicon-containing film of the comparative example illustrated in FIGS. 9, 10, 11A, 11B, 12A, and 12B. That is, in the exemplary embodiment, a silicon-containing film having a higher plasma resistance is formed, as compared with the silicon-containing film of the comparative example. For example, the etch amount at the measurement point 90 of the silicon-containing film in the exemplary embodiment is 18.0 nm, whereas the etch amount at the measurement point 90 of the silicon-containing film of the comparative example is 45.0 nm. Thus, the etch amount is decreased. Therefore, when the silicon-containing film is formed on the surface of the member disposed inside the chamber by the plasma of the silicon-containing gas and the reducing gas, the silicon-containing film (deposit) generated on the surface of the in-chamber member may have an improved plasma resistance.

The descriptions will refer back to FIG. 2. Subsequently, the plasma processing apparatus performs a plasma processing step of plasma-processing the workpiece carried into the processing chamber 1 by plasma of a processing gas (step S102). The workpiece is, for example, a semiconductor wafer W on which a silicon oxide film is stacked. Further, the processing gas is, for example, $HBr/NF_3$.

A more detailed example will be described. The controller 60 of the plasma processing apparatus carries the workpiece from the carry-in/out port 74 and the gate valve 75 into the processing chamber 1, and places the carried workpiece on the electrostatic chuck 6. Then, the controller 60 supplies the processing gas from the processing gas source 15 into the processing chamber 1, applies a high frequency power for plasma generation from the first high frequency power source 10a, and applies a high frequency power for ion attraction from the second high frequency power source 10b. As a result, the workpiece is plasma-processed.

Then, after the workpiece is carried out of the processing chamber 1, the plasma processing apparatus performs a removal step of removing the silicon-containing film from the surface of the in-chamber member by plasma of a fluorine-containing gas (step S103). The fluorine-containing gas contains, for example, at least one of $NF_3$, $SF_6$, and $CF_4$. Further, the fluorine-containing gas may contain $O_2$.

A more detailed example will be described. The controller 60 of the plasma processing apparatus carries the workpiece from the carry-in/out port 74 and the gate valve 75 to the outside of the processing chamber 1. Then, the controller 60 supplies the fluorine-containing gas from the processing gas source 15 into the processing chamber 1, and applies a high frequency power for plasma generation from the first high frequency power source 10a. At this time, the controller 60 does not apply a high frequency power for ion attraction from the second high frequency power source 10b. As a result, the silicon-containing substance is removed from the surface of the member disposed inside the processing chamber 1.

Subsequently, descriptions will be made on another exemplary process flow of the plasma processing method by the plasma processing apparatus according to the exemplary embodiment. FIG. 13 is a flowchart illustrating another exemplary process flow of the plasma processing method by the plasma processing apparatus according to the exemplary embodiment. The process flow of the plasma processing method illustrated in FIG. 13 includes a pre-film formation step of forming a carbon-containing film on the surface of the in-chamber member by plasma of a carbon-containing gas before the silicon-containing film formation step.

As illustrated in FIG. 13, the plasma processing apparatus performs a pre-film formation step to form a carbon-containing film on the surface of the in-chamber member by plasma of a carbon-containing gas (step S111). The carbon-containing gas contains, for example, a gas represented by $C_xH_yF_z$ (in which x, y, and z represent integers, and $(z-y)/x$ is 2 or less). Further, the carbon-containing gas may be, for example, a carbon-containing gas containing at least one of $CH_4$, $C_4F_8$, $CHF_3$, $CH_3F$, and $C_2H_4$. The carbon-containing gas may further contain a rare gas. The rare gas is, for example, Ar or He. The plasma processing apparatus generates a deposit, which is a carbon-containing film, on the surface of the in-chamber member by the pre-film formation step.

The controller 60 of the plasma processing apparatus supplies the carbon-containing gas from the processing gas source 15 into the processing chamber 1, and applies a high frequency power for plasma generation from the first high frequency power source 10a into the processing chamber 1 to generate plasma of the carbon-containing gas. At this time, the controller 60 does not apply a high frequency power for ion attraction from the second high frequency power source 10b. As a result, a deposit is formed as a carbon-containing film on the surface of the in-chamber member.

Next, the plasma processing apparatus performs a film formation step of forming a silicon-containing film on the surface of the in-chamber member by plasma of a silicon-containing gas and a reducing gas (step S112). Since the details of step S112 are the same as those of the above-described step S101, descriptions thereof will be omitted.

Subsequently, the plasma processing apparatus performs a plasma processing step of plasma-processing the workpiece carried into the processing chamber 1 by plasma of a processing gas (step S102). Since the details of step S113 are the same as those of the above-described step S102, descriptions thereof will be omitted.

Subsequently, after the workpiece is carried out of the processing chamber 1, the plasma processing apparatus performs a first removal step of removing the silicon-containing film from the surface of the in-chamber member by plasma of a fluorine-containing gas (step S114). Since the details of step S114 are the same as those of the above-described step S103, descriptions thereof will be omitted.

Then, the plasma processing apparatus performs a second removal step of removing the carbon-containing film from the surface of the in-chamber member by plasma of an oxygen-containing gas (step S115). The oxygen-containing gas contains at least $O_2$, and may further contain a rare gas. The rare gas is, for example, Ar or He.

A more detailed example will be described. After the first removal step of removing the silicon-containing film, the controller 60 of the plasma processing apparatus supplies the oxygen-containing gas from the processing gas source 15 into the processing chamber 1, and applies a high frequency power for plasma generation from the first high frequency power source 10a. At this time, the controller 60 does not apply a high frequency power for ion attraction from the second high frequency power source 10b. As a result, the carbon-containing film is removed from the surface of the member disposed inside the processing chamber 1.

As described above, according to the exemplary embodiment, the silicon-containing film is formed on the surface of the member disposed inside the chamber by the plasma of the silicon-containing gas and the reducing gas before the workpiece is plasma-processed. Therefore, according to the exemplary embodiment, it is possible to enhance the plasma resistance of the silicon-containing film (deposit) formed on the surface of the in-chamber member. As a result, the amount of residual halogen in the silicon-containing film is reduced as compared with the method in which the silicon oxide film is formed by the plasma of the oxygen-containing gas and the silicon-containing gas. Thus, it is possible to form a denser and higher-quality silicon-containing film, thereby improving the plasma resistance. Furthermore, since the film forming step is performed before the workpiece is plasma-processed, it is possible to enhance the plasma resistance of the in-chamber member, and to avoid consumption of the member and scattering of contaminants from the member.

Further, according to the exemplary embodiment, the silicon-containing film is removed from the surface of the inner-chamber member by plasma of a fluorine-containing gas after the plasma-processed workpiece is carried out of the processing chamber 1. As a result, the surface of the in-chamber member may be cleaned.

Further, according to the exemplary embodiment, the silicon-containing gas contains at least one of $SiF_4$, $SiCl_4$, and $SiBr_4$. As a result, it is possible to enhance the plasma resistance of the silicon-containing film (deposit) formed on the surface of the in-chamber member.

Further, according to the exemplary embodiment, the reducing gas contains at least one of $H_2$, $CH_4$, and $C_3H_6$. As a result, since the amount of residual halogen in the silicon-containing film, it is possible to enhance the plasma resistance of the silicon-containing film (deposit) formed on the surface of the in-chamber member.

Further, according to the exemplary embodiment, in the film formation step of forming the silicon-containing film, the flow rate ratio of the reducing gas to the silicon-containing gas is 0.2 or more. As a result, since the amount of residual halogen in the silicon-containing film, it is possible to enhance the plasma resistance of the silicon-containing film (deposit) formed on the surface of the in-chamber member.

Further, according to the exemplary embodiment, the pre-film formation step of forming a carbon-containing film on the surface of the member by plasma of a carbon-containing gas is further included before the film formation step. As a result, when the silicon-containing film is removed from the surface of the in-chamber member by the plasma of the fluorine-containing gas, the fluorine-containing gas does not contact the surface of the in-chamber member. Thus, it is possible to suppress the deterioration and wear of the surface of the in-chamber member.

Further, according to the exemplary embodiment, the carbon-containing gas contains a gas represented by $C_xH_yF_z$ (wherein x, y, z represents an integer, and (z−y)/x is 2 or less). As a result, it is possible to suppress the deterioration and wear of the surface of the in-chamber member.

Further, according to the exemplary embodiment, the carbon-containing gas contains at least one of $CH_4$, $C_4H_8$, $CHF_3$, $CH_3F$, and $C_2H_4$. As a result, it is possible to suppress the deterioration and wear of the surface of the in-chamber member.

Further, according to the exemplary embodiment, the removal step includes a first removal step of removing the silicon-containing film from the surface of the member by the plasma of the fluorine-containing gas and a second removal step of removing the carbon-containing film from the surface of the member by plasma of an oxygen-containing gas. As a result, the surface of the in-chamber member may be further cleaned.

Further, according to the exemplary embodiment, the silicon-containing gas further contains a rare gas. As a result, it is possible to more uniformly deposit the silicon-containing film (deposit) on the whole in-chamber member.

Further, according to the exemplary embodiment, the rare gas is Ar or He. As a result, it is possible to more uniformly deposit the silicon-containing film (deposit) on the whole in-chamber member.

(Other Exemplary Embodiments)

The plasma processing method and the plasma processing apparatus according to the exemplary embodiment have been described, but the exemplary embodiment is not limited thereto. Hereinafter, other exemplary embodiments will be described.

(Bias Voltage)

For example, a bias voltage may be applied in the film formation step. That is, in the film formation step, the controller 60 supplies the silicon-containing gas and the reducing gas from the processing gas source 15 into the processing chamber 1, and applies a high frequency power for plasma generation from the first high frequency power source 10a into the processing chamber 1 to generate plasma of the silicon-containing gas and the reducing gas. At this time, the controller 60 applies a bias voltage to the placing table 2 by applying a high frequency power for ion attraction from the second high frequency power source 10b to the placing table 2. Thus, ions in the plasma are attracted toward the placing table 2. As a result, it is possible to more precisely control the film thickness of the film on the member, as compared with the method that does not apply the bias voltage.

DESCRIPTION OF SYMBOLS

1: processing chamber
2: placing table

2a: base
2b: coolant flow path
2c: coolant inlet pipe
2d: coolant outlet pipe
3: insulating plate
3a: inner wall member
4: support table
5: focus ring
6: electrostatic chuck
6a: electrode
6b: insulator
10a: first high frequency power source
10b: second high frequency power source
15: processing gas source
16: shower head
16a: main body
16b: top plate
52: variable DC power source
60: controller
61: process controller
62: user interface
63: memory
71: exhaust port
72: exhaust pipe
73: exhaust device

The invention claimed is:

1. A plasma processing method comprising:
forming a silicon-containing film on a surface of a member disposed inside a chamber of a plasma processing apparatus by plasma of a silicon-containing gas and a reducing gas, wherein the member is a part of the plasma processing apparatus;
performing a plasma-processing on a workpiece carried into the chamber by plasma of a processing gas after the silicon-containing film is formed on the surface of the member; and
removing the silicon-containing film from the surface of the member by plasma of a fluorine-containing gas after the workpiece is carried out of the chamber after the plasma-processing is completed,
wherein, in the forming the silicon-containing film, a flow rate of the silicon-containing gas is maintained to be larger than a flow rate of the reducing gas, and a flow rate ratio of the reducing gas to the silicon-containing gas is maintained to be 0.2 or more.

2. The plasma processing method of claim 1, wherein the silicon-containing gas contains at least one of $SiF_4$, $SiCl_4$, or $SiBr_4$.

3. The plasma processing method of claim 1, wherein the reducing gas contains at least one of $H_2$, $CH_4$, or $C_3H_6$.

4. The plasma processing method of claim 1, wherein the silicon-containing gas further contains a rare gas.

5. The plasma processing method of claim 4, wherein the rare gas is Ar or He.

6. The plasma processing method of claim 1, wherein in the forming the silicon-containing film, a high frequency power for plasma generation is applied into the chamber to generate the plasma of the silicon-containing gas and the reducing gas and a high frequency power for ion attraction is not applied into the chamber.

7. The plasma processing method of claim 1, wherein the fluorine-containing gas contains at least one of $NF_3$, $SF_6$ or $CF_4$.

8. The plasma processing method of claim 7, wherein the fluorine-containing gas further contains $O_2$.

9. A plasma processing method comprising:
forming a silicon-containing film on a surface of a member disposed inside a chamber provided as a part of a plasma processing apparatus by plasma of a silicon-containing gas and a reducing gas, wherein the member is a part of the plasma processing apparatus;
performing a plasma-processing on a workpiece carried into the chamber by plasma of a processing gas after the silicon-containing film is formed on the surface of the member;
removing the silicon-containing film from the surface of the member by plasma of a fluorine-containing gas after the workpiece is carried out of the chamber after the plasma-processing is completed; and
forming a carbon-containing film on the surface of the member by plasma of a carbon-containing gas before the forming the silicon-containing film.

10. The plasma processing method of claim 9, wherein the carbon-containing gas contains a gas represented by $C_xH_yF_z$ (wherein x, y, z represents an integer, and (z-y)/x is 2 or less).

11. The plasma processing method of claim 9, wherein the carbon-containing gas contains at least one of $CH_4$, $C_4H_8$, $CHF_3$, $CH_3F$, or $C_2H_4$.

12. The plasma processing method of claim 11, wherein the carbon-containing gas further contains a rare gas.

13. The plasma processing method of claim 12, wherein the rare gas is Ar or He.

14. The plasma processing method of claim 9, wherein the removing the silicon-containing film includes removing the silicon-containing film from the surface of the member by the plasma of the fluorine-containing gas and, after removing the silicon-containing film, removing the carbon-containing film from the surface of the member by plasma of an oxygen-containing gas.

15. A plasma processing apparatus comprising:
a chamber in which a workpiece is plasma-processed;
an exhaust unit that decompresses an inside of the chamber;
a gas supply unit that supplies a processing gas to the inside of the chamber;
a plasma generator that generates plasma in the chamber using the processing gas; and
a controller
including a memory and a processor coupled to the memory, the processor configured to:
form a silicon-containing film on a surface of a member disposed inside a chamber by plasma of a silicon-containing gas and a reducing gas, wherein the member is a part of the plasma processing apparatus;
perform a plasma-processing on a workpiece carried into the chamber by plasma of a processing gas after the silicon-containing film is formed on the surface of the member; and
remove the silicon-containing film from the surface of the member by plasma of a fluorine-containing gas after the workpiece is carried out of the chamber after the plasma-processing is completed, and
regulate a flow rate of the silicon-containing gas to be larger than a flow rate of the reducing gas and a flow rate ratio of the reducing gas to the silicon-containing gas to be 0.2 or more in forming of the silicon-containing film.

* * * * *